United States Patent [19]

Shimane et al.

[11] Patent Number: 4,955,780
[45] Date of Patent: Sep. 11, 1990

[54] WAFER POSITIONING APPARATUS

[75] Inventors: Kazuo Shimane, Kawasaki; Nobuo Iijima, Tama; Tatsuro Kawabata, Kawasaki, all of Japan

[73] Assignee: Fujitsu Limited, Kawasaki, Japan

[21] Appl. No.: 257,321

[22] Filed: Oct. 13, 1988

[30] Foreign Application Priority Data

Oct. 20, 1987 [JP] Japan .................. 62-262736

[51] Int. Cl.$^5$ ............................................. B25J 13/08
[52] U.S. Cl. ................... 414/744.2; 901/47; 901/6; 250/548; 414/783; 414/744.5
[58] Field of Search ................... 901/6, 9, 47; 414/744.5, 744.2, 744.6, 783; 250/548, 561; 356/400, 394; 198/395; 318/640, 480; 364/559

[56] References Cited

U.S. PATENT DOCUMENTS

| | | | |
|---|---|---|---|
| 3,820,647 | 6/1974 | Waugh, Jr. et al. | 198/395 X |
| 4,024,944 | 5/1977 | Adams et al. | 198/394 |
| 4,483,654 | 11/1984 | Koch et al. | 414/744.5 |
| 4,584,045 | 4/1986 | Richards | 414/744.5 |
| 4,633,419 | 12/1986 | Niiho et al. | 364/559 |
| 4,770,590 | 9/1988 | Hugues | 901/47 X |
| 4,819,167 | 4/1989 | Cheng | 901/6 X |

FOREIGN PATENT DOCUMENTS 60-85536  5/1985  Japan .
0474435  9/1975  U.S.S.R. .................. 901/6

Primary Examiner—David A. Bucci
Assistant Examiner—William M. Hienz
Attorney, Agent, or Firm—Staas & Halsey

[57] ABSTRACT

A wafer positioning apparatus includes at least first, second and third optical position detectors for detecting a circumference portion of a wafer. The first to third optical position detectors are arranged on a circumference of a circle having a diameter identical to that of the wafer. A transportation robot is used for holding the wafer and moving the held wafer with respect to the first to third optical position detectors. A control circuit controls the transportation robot in accordance with output signals of the first to third optical position detectors so that all of the first to third optical position detectors detect the circumference portion of the wafer at the same time.

12 Claims, 17 Drawing Sheets

⟨83⟩

⟨86⟩

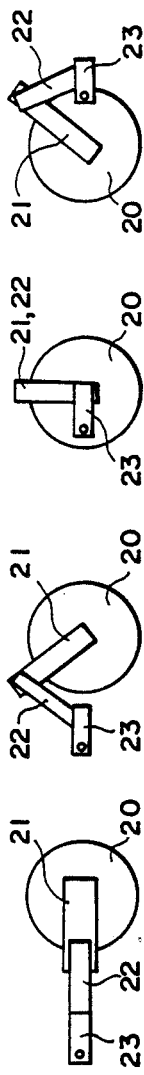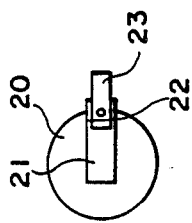

⟨83⟩

⟨84⟩

⟨65⟩

⟨86⟩

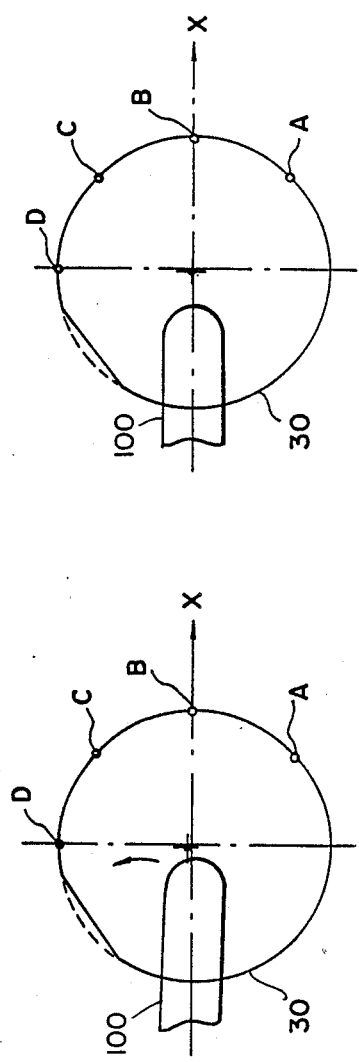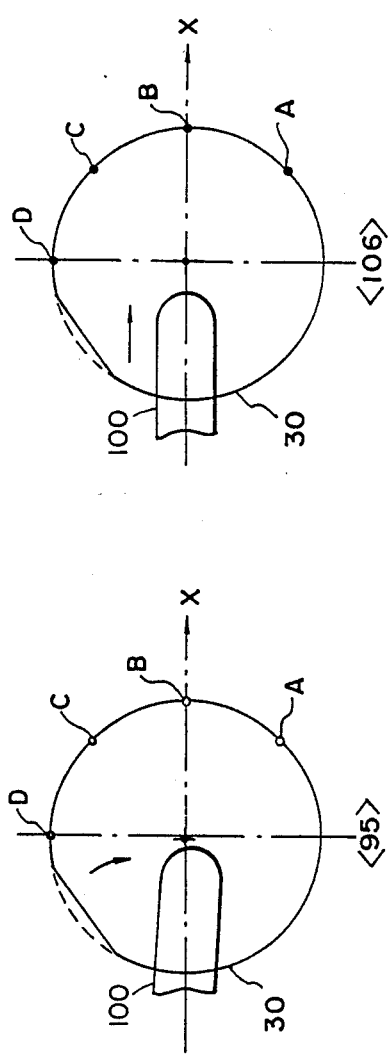

⟨83⟩

⟨84⟩

⟨65⟩

⟨86⟩

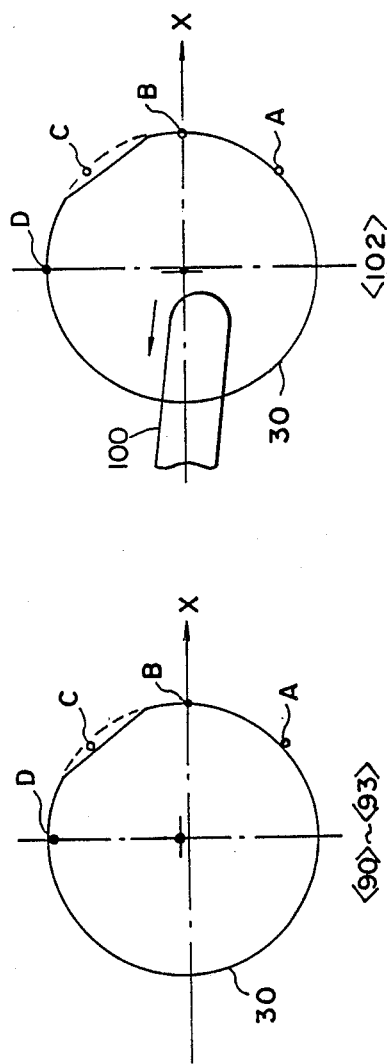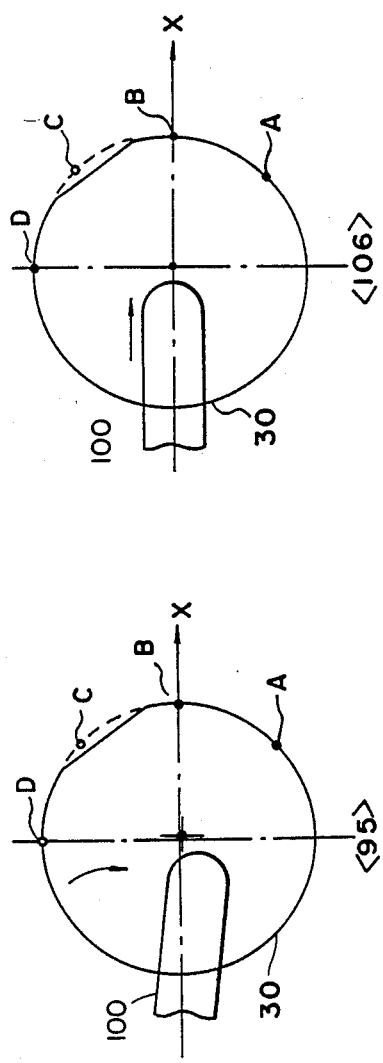

<83>

<84>

<65>

<85>

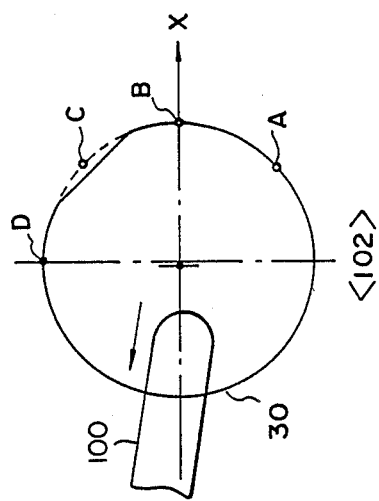
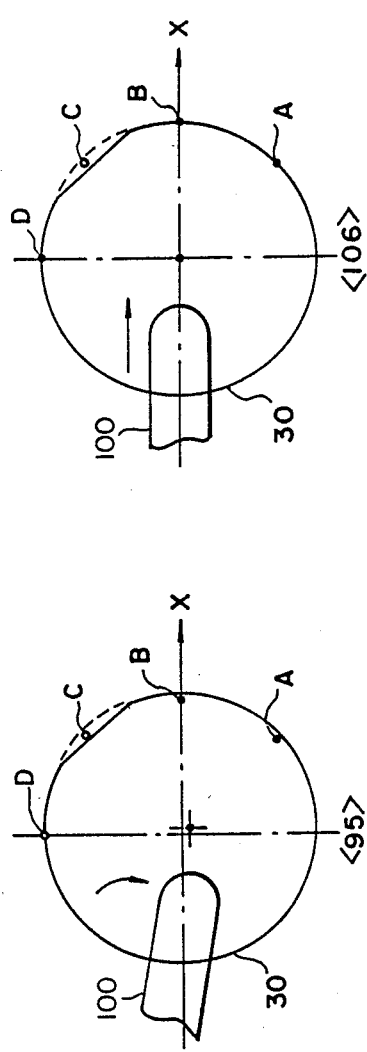

WAFER POSITIONING APPARATUS

BACKGROUND OF THE INVENTION

The present invention generally relates to a wafer positioning apparatus, and more particularly to a wafer positioning apparatus for positioning a wafer which employs photosensors and a transportation robot.

A wafer positioning apparatus is employed in equipment which handles a wafer such as a semiconductor wafer. For example, when a wafer is accommodated into a carrier station, it is necessary to position the wafer so as to prevent the wafer from coming into collision with the carrier station and being damaged. After the wafer is positioned, it is transported to the carrier station, and is then accommodated therein. A wafer positioning apparatus is an apparatus for enabling the above positioning operation.

A conventional wafer positioning apparatus includes two opposed wafer holding members, which are located so that a wafer is interposed therebetween. At the time of positioning the wafer, the holding members are driven so as to make pressure contact with and hold opposed circumferential portions of the wafer. However, the above wafer positioning apparatus may damage circumferential portions of the wafer and may deform the wafer.

In order to overcome the above problems, another wafer positioning apparatus has been proposed in the Japanese Laid-Open Patent Application No.60-85536. The disclosed wafer positioning apparatus includes a suction holder and at least three optical position detectors. Each of the optical position detectors consists of a light-emitting diode and a photodetector, which are arranged so as to be opposite to each other. When the wafer becomes positioned under the light-emitting diode, the photodetector is prevented from receiving the light emitted from the light-emitting diode.

Two of the three optical position detectors are arranged along an orientation flat portion formed in a wafer which is a straight peripheral portion of the wafer. The two optical position detectors are spaced at a distance shorter than the length of the orientation flat portion. When the two optical position detectors detect the orientation flat portion, and simultaneously the third position detector detects the circumferential portion of the wafer, the wafer positioning operation is completed. In order to obtain the above state, the wafer, held by the suction holder, is moved in X and Y directions and is rotated in accordance with signals supplied from the optical position detectors.

However, the proposed wafer positioning apparatus has disadvantages described below. First, it is difficult to fabricate a compact wafer positioning apparatus, because a mechanism for rotating the wafer around a rotation axis by at least one rotation is necessary to position the orientation flat portion under the two optical position detectors for detecting the orientation flat portion. Secondly, the proposed wafer positioning apparatus cannot position a wafer which does not have an orientation flat portion.

SUMMARY OF THE INVENTION

Accordingly, a general object of the present invention is to provide a wafer positioning apparatus in which the disadvantages of prior such apparatus are eliminated.

A more specific object of the present invention is to provide a compact wafer positioning apparatus.

Another object of the present invention is to provide a wafer positioning apparatus in which the wafer can be positioned without detecting the orientation flat portion thereof. Therefore, the apparatus is not limited in use to a particular type of wafer.

The above objects of the present invention are achieved by a wafer positioning apparatus which includes first, second and third optical position detectors for detecting a circumference portion of a wafer, the first to third optical position detectors being arranged on a circumference of a circle having a diameter identical to that of the wafer, a transportation robot for holding the waver and moving the held wafer with respect to the first to third optical position detectors, and a control circuit for controlling the transportation robot in accordance with output signals of the first to third optical position detectors so that all of the first to third optical position detectors detect the circumference portion of the wafer at the same time.

It is preferable to provide a fourth optical position detector for detecting the circumference portion of the wafer. The fourth optical position detector is arranged on the circumference of the circle having the diameter identical to that of the wafer. The use of the four optical position detectors makes it possible to correctly position the wafer irrespective of the position of an orientation flat portion of the wafer.

Other objects, features and advantages of the present invention will become apparent from the following detailed description when read in conjunction with the accompanying drawings.

BRIEF DESCRIPTION OF THE DRAWINGS

FIGS. 4(A) through 4(E) are views for explaining extension and contraction of the arm of the transportation robot;

FIGS. 10(A) through 10(J) are views showing positions of the wafer and the arm observed during the positioning operation, in which the wafer is initially at a position shown in FIG. 10(A);

FIGS. 11(A) through 11(J) are views showing positions of the wafer and the arm during the positioning operation, in which the wafer is initially at a position shown in FIG. 11(A); and FIGS. 12(A) through 12(J) are views showing positions of the wafer and the arm during the positioning operation, in which the wafer is initially at a position shown in FIG. 12(A).

DETAILED DESCRIPTION

A description is given of a preferred embodiment of the present invention.

Figure 1:
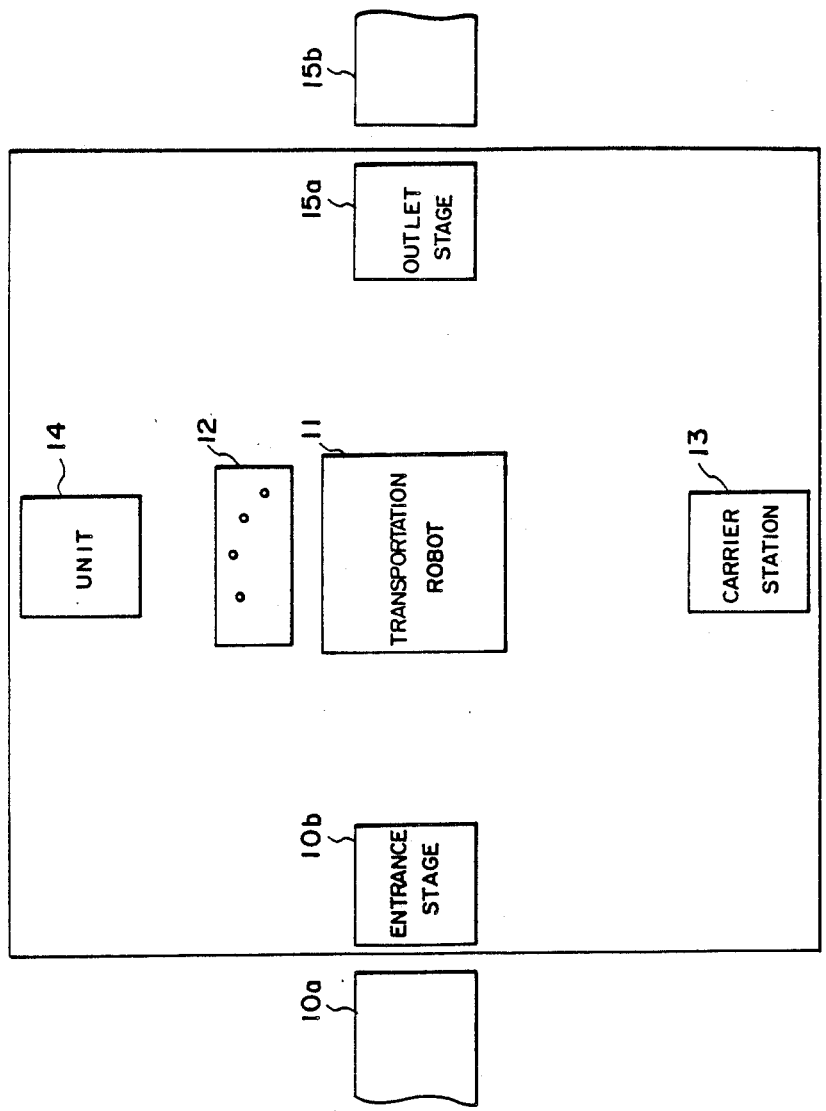
FIG. 1 is a plan view of a system which employs a wafer positioning apparatus in accordance with a preferred embodiment of the present invention.

Referring to FIG. 1, a semiconductor wafer such as a silicon wafer is transported along a transportation path 10a, and is then placed on an entrance stage 10b. A transportation robot 11 sucks the wafer placed on the entrance stage 10b, and then moves it to a centering unit 12. Then the transportation robot 11 subjects the wafer in the centering unit 12 to a positioning (centering) operation, and then transports the positioned wafer to a carrier station 13 used for accommodating wafers. Thereafter, the transportation robot 11 takes out the wafer from the carrier station 13, and then moves it to a unit 14. The unit 14 turns the wafer so as to position it on the basis of an orientation flat portion of the wafer, and then subjects the positioned wafer to a predetermined process, which coats a resist film on the entire surface of the wafer, for example. Finally, the transportation robot 11 takes the wafer from the unit 14, and moves it to an outlet stage 15a. The wafer on the outlet stage 15a is then transported along a transportation path 15b.

Figure 2:
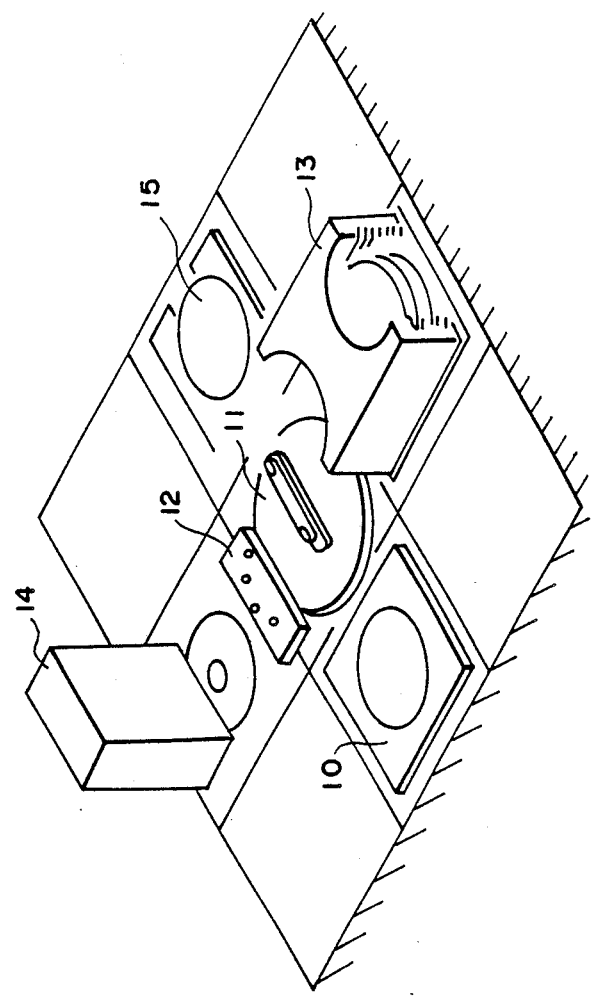
FIG. 2 is a perspective view of the system shown in FIG. 1.
Figure 3A:
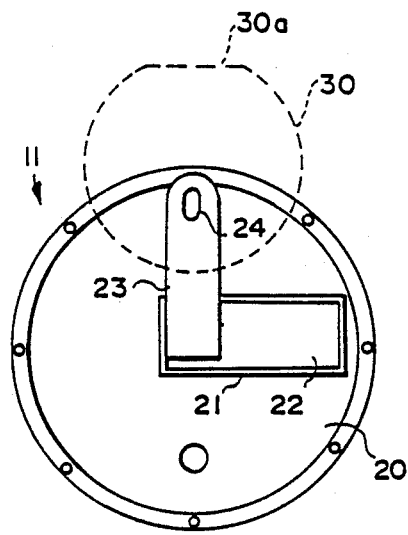
FIG. 3(A) is a plan view of a transportation robot 11 used in the system of FIGS. 1 and 2, in which an arm of the transportation robot is in a home position.
Figure 3B:
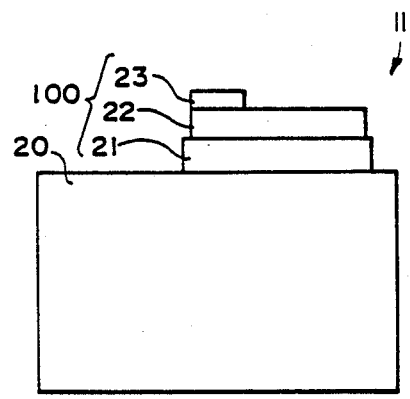
FIG. 3(B) is a side view of the transportation robot, in which the arm is in a contracted state.
Figure 3C:
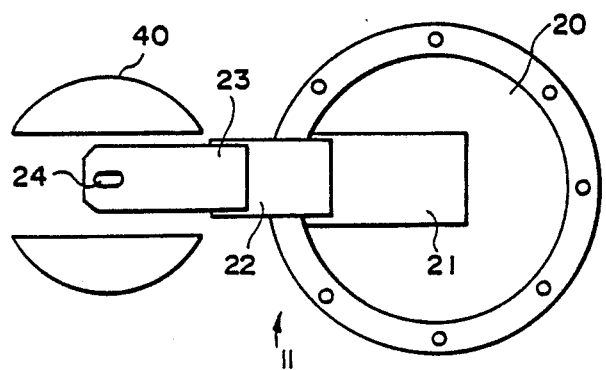
FIG. 3(C) is a plan view of the transportation robot, in which the arm is in an extended state.

Referring to FIG. 3(A) and 3(B), the transportation robot 11 includes a robot main body 20 and first, second and third arms 21, 22 and 23. A composite arm 100 of the transportation robot 11 comprises first, second and third arms 21, 22 and 23. The first arm 21 is rotatably supported on, or connected to, the robot main body 20. The second arm 22 is rotatably supported on, or connected to, the first arm 21. The third arm 23 is rotatably supported on or connected to, the second arm 22. The third arm 23 has a suction hole 24. In FIG. 3(A), the first and second arms 21 and 22 are in an overlapping state, and the suction hole 24 is located above the robot main body 20. A broken line represents a wafer 30 having an orientation flat portion 30a. In FIG. 3(C), the arm 100 of the transportation robot 11 is in an extended state so that the suction hole 24 is positioned above a centering stage 40 located under the centering unit 12 (FIGS. 1 and 2).

The arm 100 of the transportation robot 11 can extend and contract in a sequence of steps shown in FIGS. 4(A), 4(B), 4(c), 4(D) and 4(E) or a sequence of FIGS. 4(E), 4(D), 4(C), 4(B) and 4(A).

Figure 5A:
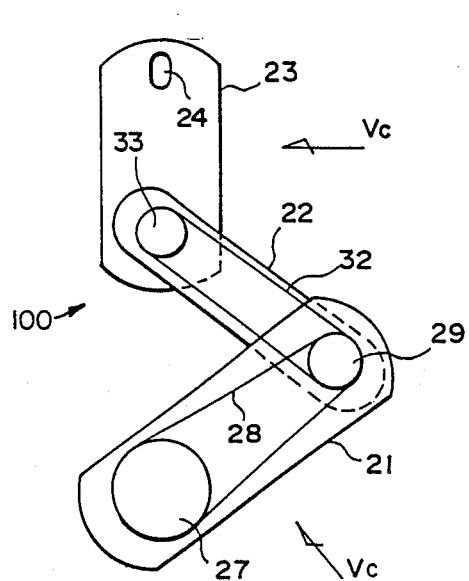
FIGS. 5(A) through 5(D) are views showing the transportation robot.
Figure 5B:
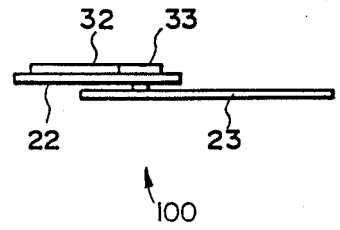
Figure 5C:
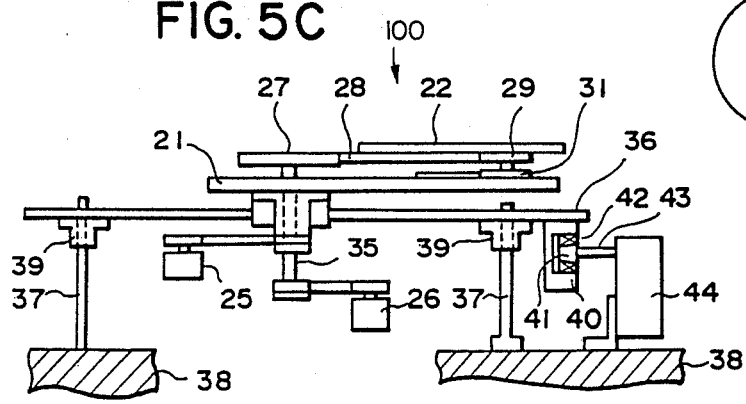

The transportation robot 11 has a structure shown in FIGS. 5(A) through 5(D), which enables extension and contraction of the arm 100. FIG. 5(B) is a side view, viewed from a direction of an arrow Vb shown in FIG. 5(A), and FIG. 5(C) is a side view, viewed from a direction of an arrow Vc. Stepping motors 25 and 26 are accommodated in the robot main body 11. The stepping motor 25 is used for rotating the first arm 21 which is rotatably supported on the robot main body 11. The stepping motor 26 rotates a pulley 27 which is guided by the first arm 21 and is connected directly to a rotary shaft 35. A pulley 29 is fixed to the second arm 22. The pulley 27 drives the pulley 29 by a belt 28 stretched therebetween. A pulley 31, which is coaxial with the pulley 29, is fixed to the first arm 21. A pulley 33 is fixed to the third arm 23. The pulley 31 drives the pulley 33 by a belt 32 stretched therebetween. The pulleys 29, 31 and 33 have the same diameter, which is half of the diameter of the pulley 27. When the pulley 27 is rotated by the motor 25, the second arm 22 rotates because the pulley 29 is fixed to the second arm 22. When the first arm 21 rotates in a state where the pulley 27 is kept stationary, the pulley 29 rotates in a direction opposite to the direction of rotation of the first arm 21, and thereby the second arm 22 is rotated. During this operation, the belt 32 rotates and thereby the pulley 33 rotates. Therefore, the third arm 23 moves linearly along a direction in which the third arm 23 remove away from or approaches a rotary shaft 35 of the pulley 27. Further, when the pulley 27 and the first arm 21 rotate in the same direction in synchronism with each other, the first, second and third arms 21, 22 and 23 are turned counterclockwise or clockwise as one body.

Figure 5D:
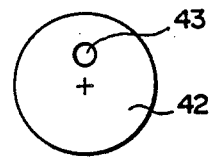

Referring to FIGS. 5(C) and 5(D), the shaft 27 is rotatably supported by a plate member 36. Shafts 37, which are mounted on a base 38, slidably support the plate member 36. Bearing boxes 39 through which the shafts 37 pass, are provided so that the plate member 36 may be made to smoothly slide along the shafts 37. Top ends of the bearing boxes 39 make contact with a bottom face of the plate member 36. A cam box 40 is fixed to a peripheral portion of the plate member 36. An eccentric cam 41 is accommodated into an inner region of the cam box 40. A peripheral surface of the eccentric cam 41 engages with a gear 42, which is fixed to an inner wall of the cam box 40. An end of a shaft 43 is fastened on a face of the eccentric cam 41 so as to be positioned at an off-center portion of the eccentric cam 41. The shaft 43 is rotated by an air actuator 44, which is mounted on the base 38. A stepping motor may be used in place of the air actuator 44. The plate member 36 is driven upwards and downwards in response to the rotation of the eccentric cam 41.

Figure 6A:
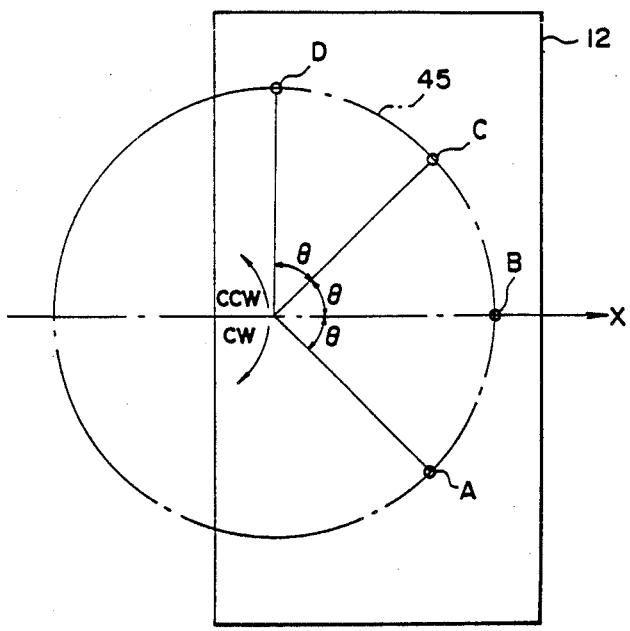
FIGS. 6(A) through 6(C) are views for explaining a centering unit 12 provided in the system of FIG. 2.
Figure 6C:
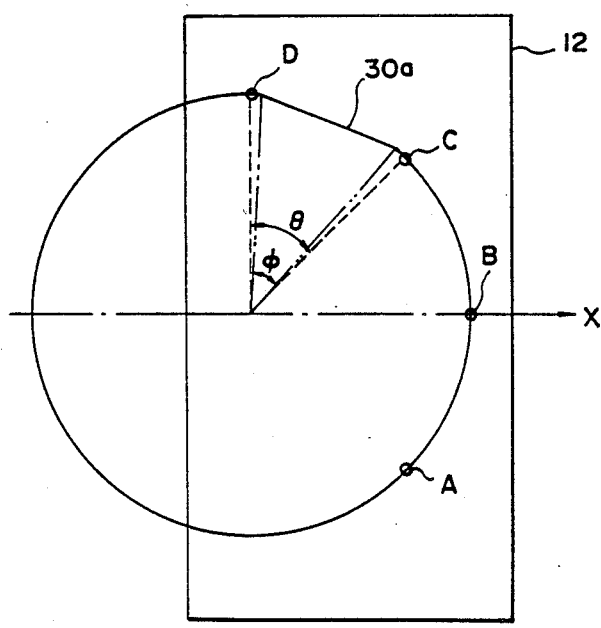
Figure 6B:
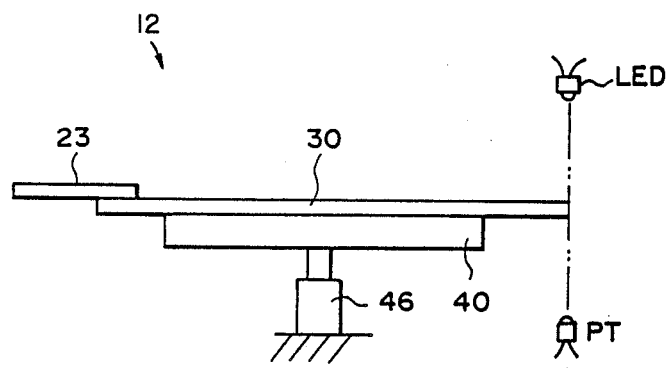

Referring to FIG. 6(A), the centering unit 12 includes four optical position detectors A through D. Each of the optical position detectors A through D includes a phototransistor PT and a light-emitting diode LED, as shown in FIG. 6(B). The centering unit 12 includes the centering stage 40. The centering stage 40 is located so as not to intersect light emitted from the light-emitting diodes LEDs. The centering stage 40 is driven upwards and downwards by an actuator 46. A wafer 30 may be placed on the centering stage 40. In FIG. 6(A), the transportation robot 11 is located on the left-hand side of the centering unit 12 on an axis X.

The optical position detectors A through D are located on a circle represented by a one-dotted chain line 45 which is identical to the diameter of the wafer 30 to be processed in the embodiment. Further, neighboring optical position detectors such as A and B are located so as to have an angle $\theta$ which is formed by lines which connect the center of the circle 45 to the neighboring optical position detectors. As shown in FIG. 6(C), the angle $\theta$ is selected so as to be greater than an angle $\emptyset$ which is formed by lines which connect the center of the wafer 30 (which coincides with the center of the circle 45) and ends of the orientation flat portion 30a of the wafer 30 which has a diameter identical to that of the circle 45. In the embodiment, when any three optical position detectors such as A, B and C out of the optical position detectors A through D are turned ON, the centering (positioning) operation is completed, or in other words, the wafer 30 has been completely positioned or centered, so that the center of the wafer 30 is made to coincide with the center of the circle 45. In the following description, an ON state of each optical position detector A–D means a state where the light emitted from the light-emitting diode LED is intersected by the wafer 30. If the angle $\emptyset$ is greater than the angle $\theta$, there is a probability that only two optical position detectors may be ON, and the other optical position detectors may be OFF. In this case, it is difficult to correctly position the wafer. It is noted that the arrangement of the four optical position detectors A–D of FIG. 6(A) makes it possible to correctly position the wafer 30 having the orientation flat portion 30a irrespective of the position of the orientation flat portion of the wafer. In case where a wafer having no orientation flat portion is subjected to te positioning operation, it can be correctly positioned by using any three optical position detectors such as A, B and C.

Figure 7:
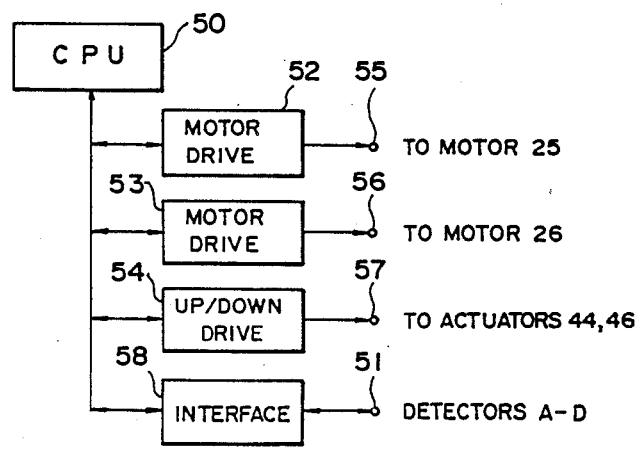
FIG. 7 is a block diagram of a control circuit provided in the apparatus of FIGS. 1 and 2.

The robot main body 20 of the transportation robot 11 includes a control circuit shown in FIG. 7. A central processing unit (hereinafter simply referred to as a CPU) 50 controls motor driving circuits 52 and 53, and an up/down driving circuit 54, in accordance with output signals of the optical position detectors A–D which pass through a terminal 51 and an interface circuit 58. The motor driving circuit 52 generates a driving pulse signal, which is supplied to the stepping motor 25 (FIG. 5(C)) through an output terminal 55. The motor driving circuit 53 generates a driving pulse signal, which is supplied to the stepping motor 26 (FIG. 5(C)) through an output terminal 56. The up/down driving circuit 54 generates a driving signal to be supplied to the actuator 44 (FIG. 5(C)) through an output terminal 57, and a driving signal to be supplied to the actuator 46 (FIG. 6(B)) through the output terminal 57.

A description is given the wafer positioning operation of the embodiment.

Figure 8A:
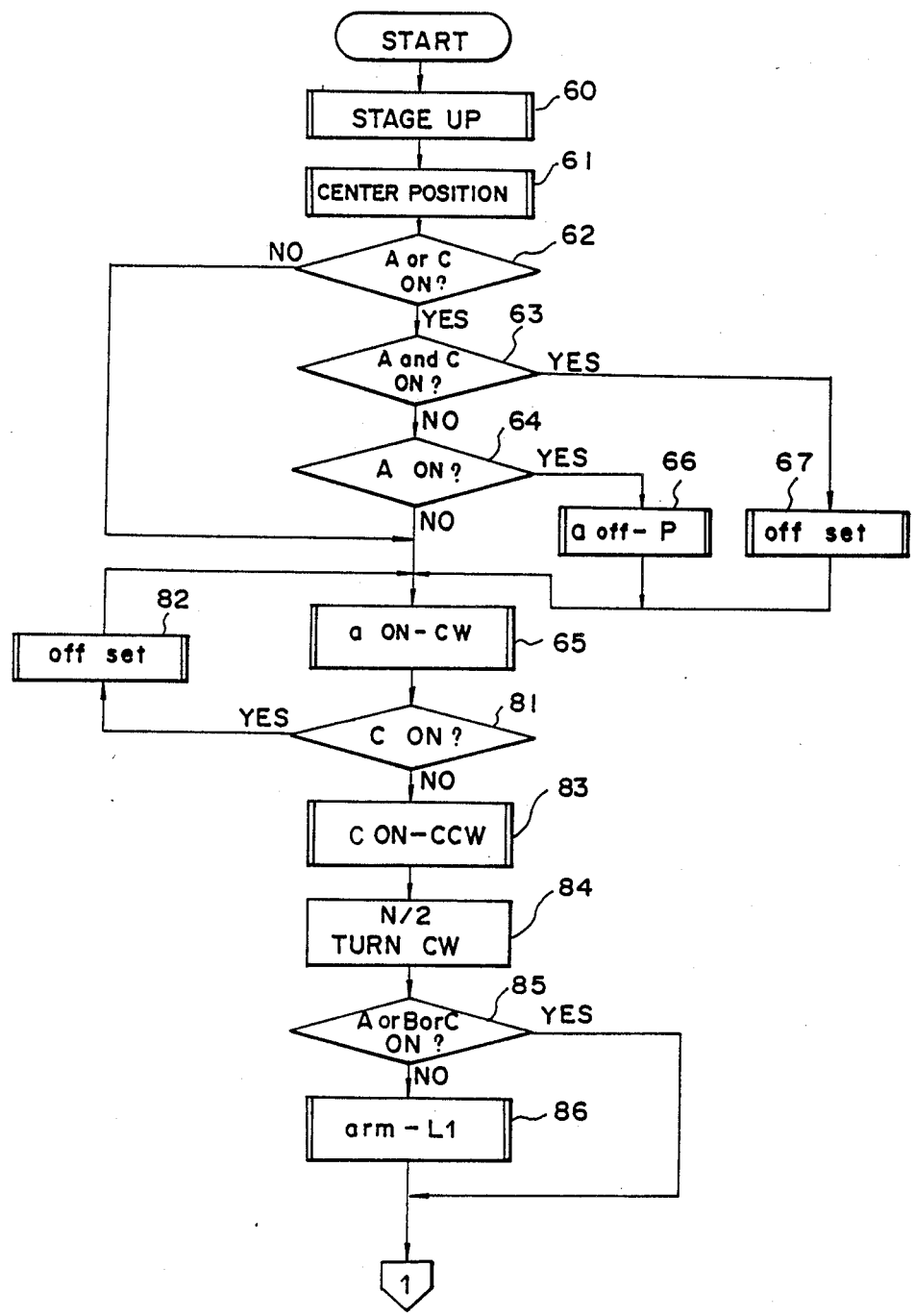
FIGS. 8(A) and 8(B) are flowcharts of a positioning operation of the embodiment of the present invention.
Figure 8B:
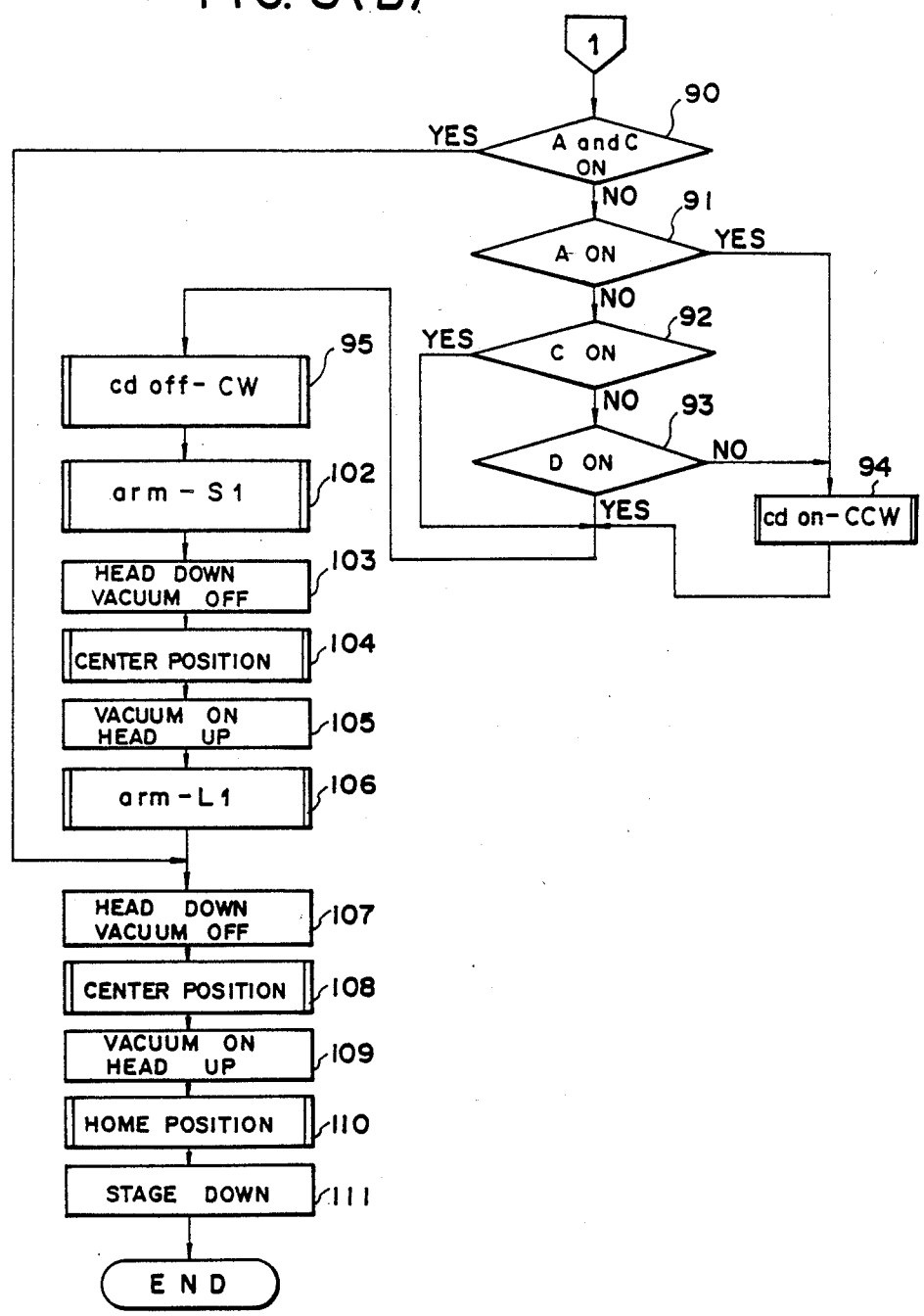
Figure 10A:
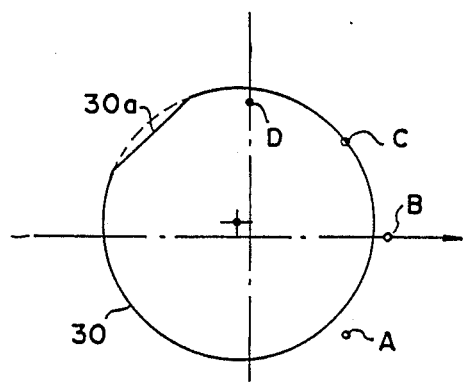
Figure 11A:
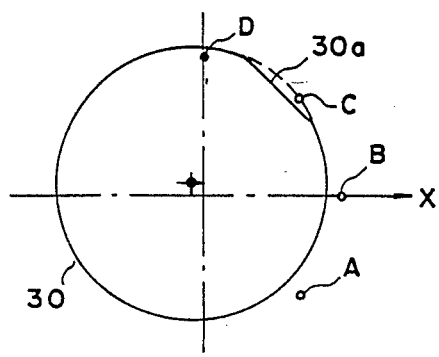
Figure 12A:
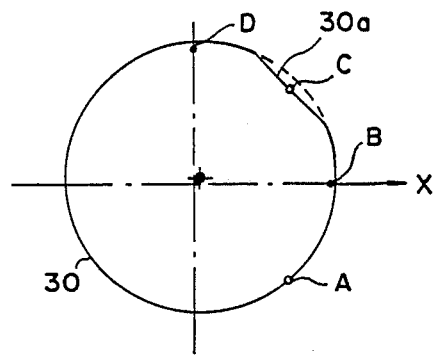

The wafer positioning (centering) operation controlled by the CPU 50 is shown in flowcharts of FIGS. 8(A) and 8(B)). Referring to FIGS. 8(A) and 8(B), the centering stage 40 is driven upwards in order to enable the wafer 30 to be placed on the centering stage 40 (step 60 of FIG. 8(A). Then, the transportation robot 11 is driven so that the end of the composite arm 100 is located above the wafer 30 positioned on the entrance stage 10. Then the wafer 30 is held by the suction hole 24, and is then moved so that the wafer 30 is located at the center position of the centering unit 12 (step 61), which coincides with the center of the circle 45 along which the optical position detectors A–D are arranged. It is noted that generally the wafer 30 may be placed on the entrance stage 10b in a state where it deviates in position from a center thereof. Therefore, in most cases, the suction hole 24 sucks an off-center portion of the wafer 30. As a result, the center of the wafer 30 seldom coincides with the center position of the centering unit 12. The wafer shown in FIG. 10(A) is located in a state where the orientation flat portion 30a is located on the left-hand side of the optical position detector D and only the optical position detector D is ON. The wafer shown in FIG. 11(A) is located in a state where the orientation flat portion 30a is located in the vicinity of the optical position detector C, and only the optical position detector D is ON. The wafer shown in FIG. 12(A) is located in a state where the orientation flat portion 30a is located in the vicinity of the optical position detector C, and the optical position detectors B and D are ON.

Next, it is discriminated whether or not the optical position detector A or C is ON (step 62). If the discriminated result is NO, the processing proceeds to step 65.

On the other hand, if the discriminated result is YES, step 63 is carried out, where it is discriminated whether or not both the optical position detectors A and C are ON. If the discriminated result in step 63 is YES, the processing proceeds to step 67. If the discriminated result in step 63 is NO, step 64 is carried out. At step 64, it is checked whether or not only the optical position detector A is ON. If the discrimination result in step 64 is YES, step 66 is performed. If the discriminated result is NO, the processing proceeds to step 65. In FIGS. 10(A) through 10(J), 11(A) through 11(J), and 12(A) through 12(J), a symbol "●" denotes that the corresponding optical position detector is ON, and a symbol "o" denotes that the corresponding optical position detector is OFF. A symbol "+" denotes the center of the wafer 30. An intersection of one-dotted chain lines perpendicular to each other denotes the center position of the centering unit 12. Further, a numeral in < > denotes the corresponding step shown in FIGS. 8(A) and 8(B).

Figure 9A:
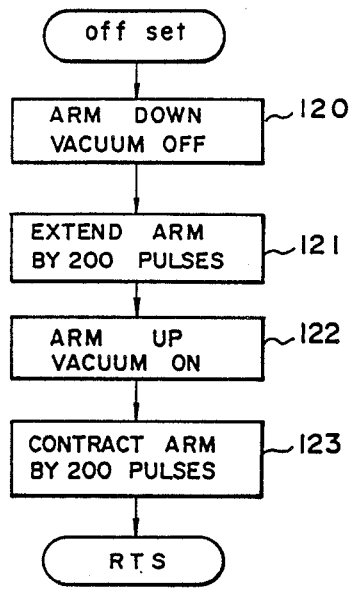
FIGS. 9(A) through 9(H) are flowcharts of subroutines included in the sequence of FIGS. 8(A) and 8(B)

The process (subroutine) in step 67, which is entitled "off set", is shown in detail in FIG. 9(A). The arm 100 of the transportation robot 11 is driven downwards and then the wafer is placed on the centering stage 40 by disabling the sucking operation (step 120). Next, the arm 100 is extended by a length which amounts to 200 pulses of the driving pulse signal (step 121). The extension of the arm 100 means that the position of the arm 100 of FIG. 4(B) is changed to that of the arm 100 of FIG. 4(A). Thereby, the suction hole 24 provided in the third arm 23 is located on a right-hand side of the X axis of FIG. 6(A). Thereafter, the wafer 30 is held by the third arm 23 by activating the sucking operation (step 122) Then the arm 100 is contracted by a length which amounts to 200 pulses of the driving pulse signal (step 123). Thereby, the wafer 30 is shifted by about 0.2 mm towards the left-hand side of the axis X of FIG. 6.(A).

Figure 9B:
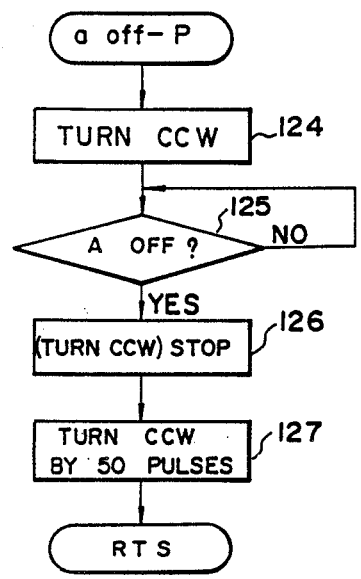

The process in step 66, which is entitled "a off-P", is shown in detail in FIG. 9(B). The arm 100 is turned counterclockwise, until the optical position detector A is turned OFF (steps 124, 125 and 126). Then the arm 100 is further turned counterclockwise by an angle which amounts to 50 pulses of the driving pulse signal (step 137). Then step 65 is performed.

Figure 9C:
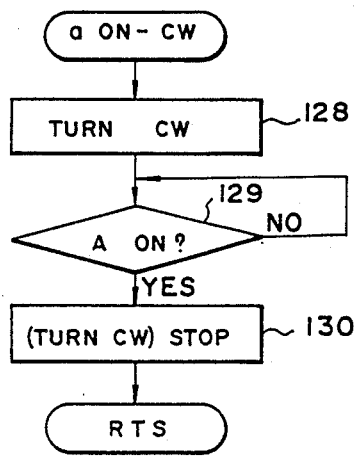
Figure 10D:
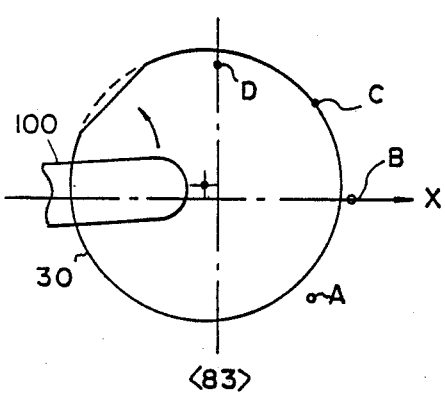
Figure 10B:
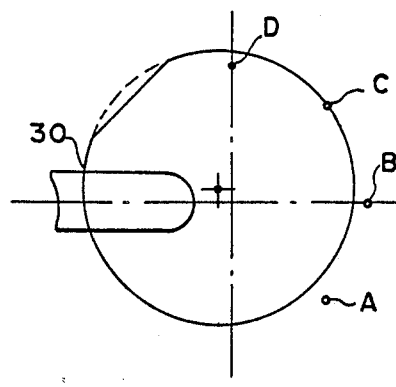
Figure 10E:
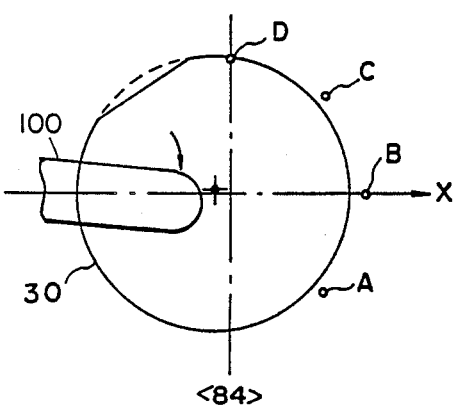
Figure 10C:
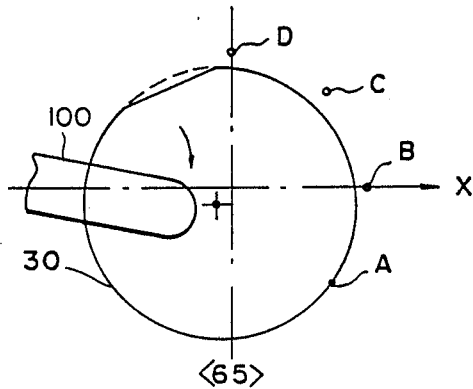
Figure 11D:
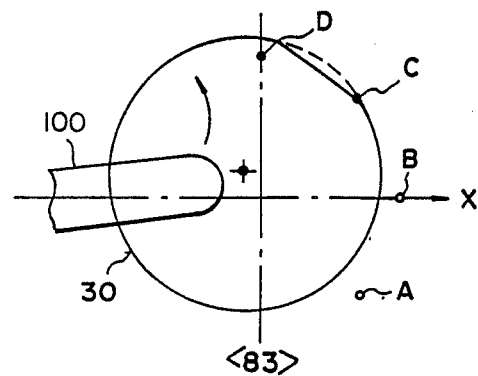
Figure 11B:
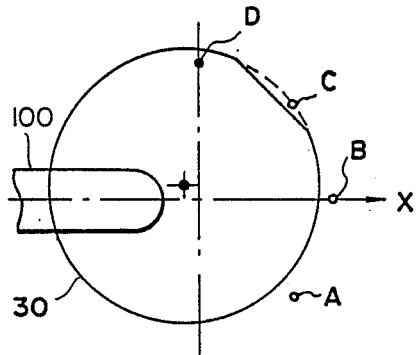
Figure 11E:
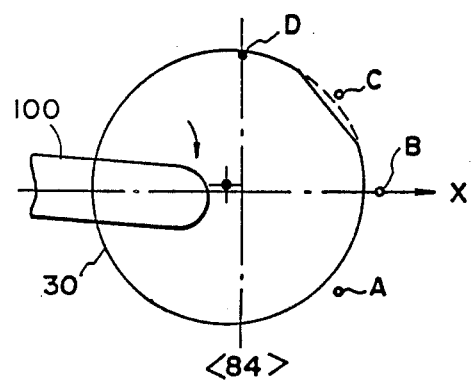
Figure 11C:
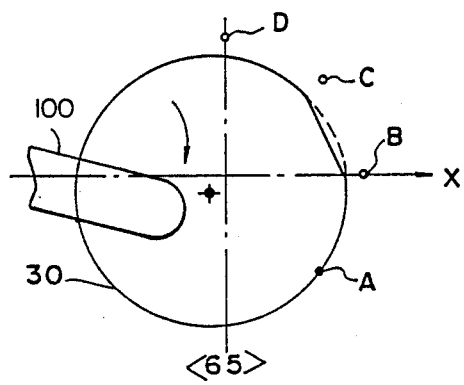
Figure 12D:
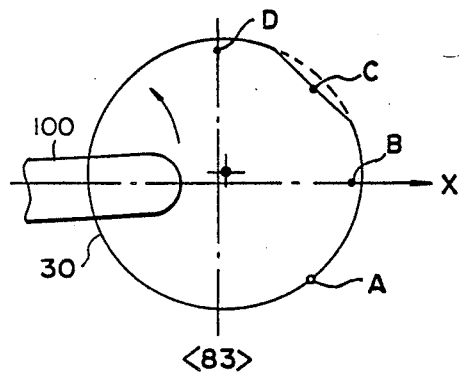
Figure 12B:
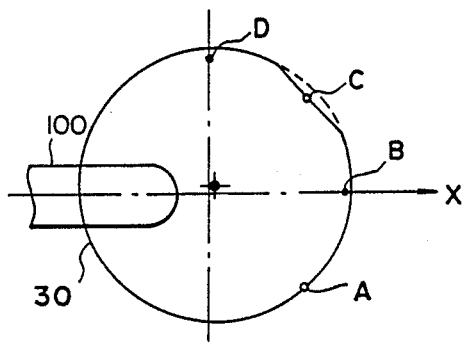
Figure 12E:
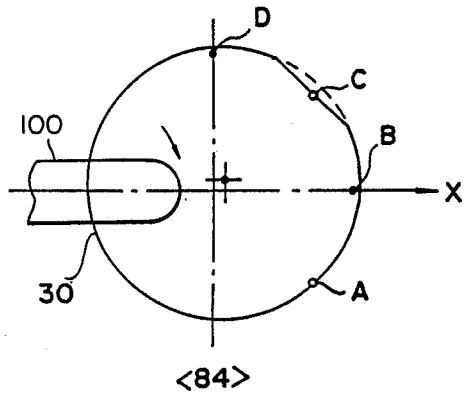
Figure 12C:
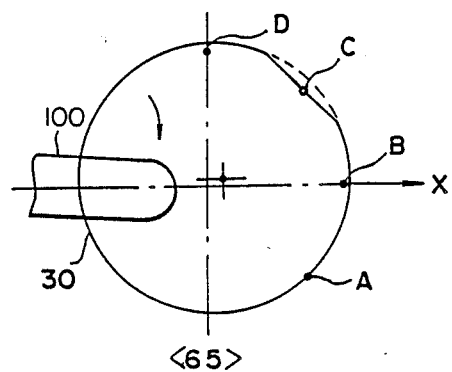

The process in step 65, which is entitled "a on-cw", is shown in detail in FIG. 9(C). As shown, the arm 100 is turned clockwise until the optical position detector A is turned ON (steps 128–130). The arm 100 and the wafer 30 before step 65 have any of the positions shown in FIGS. 10(B), 11(B) and 12(B). The arm 100 and the wafer 30 are shown in FIGS. 10(C), 11(C) and 12(C) when the discrimination result 81 becomes NO. Thereafter, it is discriminated whether or not the optical position detector C is ON (step 81). If the optical position detector C is ON, the processing proceeds to step 82. On the other hand, if the discriminated result is NO, the processing proceeds to step 83.

Figure 9D:
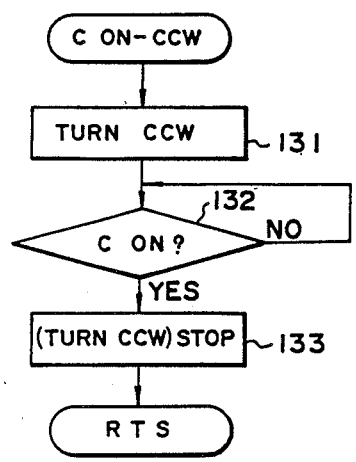

At step 82, a process which is the same as the aforementioned process of in FIG. 9(A), is performed. The process in step 83, which is entitled "c on-ccw", is shown in detail in FIG. 9(D). As shown in FIG. 9(D), the arm 100 is turned counterclockwise until the optical position detector C is turned ON (steps 131–133). The arm 100 and the wafer 30 after step 83 are shown in FIGS. 10(D), 11(D) and 12(D).

Figure 9E:
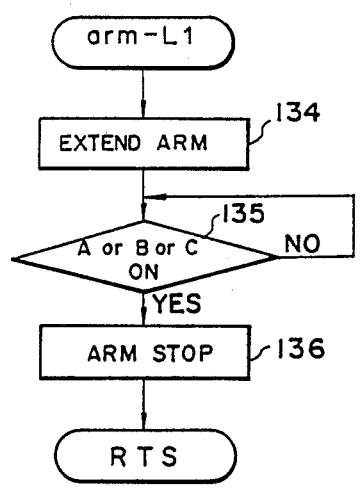
Figure 10F:
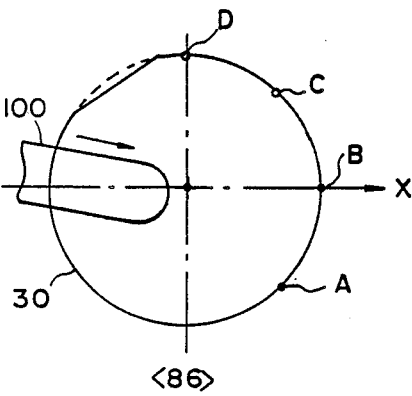
Figure 11F:
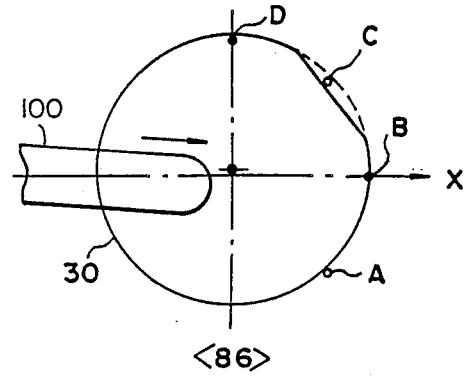
Figure 12F:
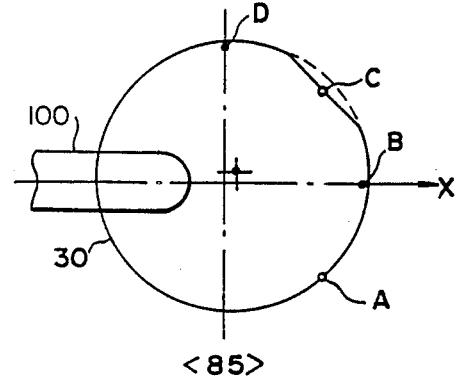

At step 84, the arm 100 is turned clockwise by an angle which amounts to half of the number N of pulses in step 83. Thereby, positions of the arm 100 and the wafer 30 are changed as shown in FIGS. 10(E), 11(E) and 12(E). Then, it is discriminated whether or not any one of the optical position detectors A, B and C is ON (step 85). If all the optical position detectors A, B and C are OFF, step 86 is carried out. The process in step 86, which is entitled "arm-L1", is shown in detail in FIG. 9(E). As shown in FIG. 9(E), the arm 100 is extended until any one of the optical position detectors A, B and C is turned ON (steps 134, 135 and 136). Thereby, positions of the arm 100 and the wafer 30 are changed as shown in FIGS. 10(F), 11(F) and 12(F).

Thereafter, it is discriminated whether or not the optical position detectors A and C are ON (step 90 of FIG. 8(B)). If the discriminated result is YES, the processing proceeds to step 107, described later. On the other hand, if the result in step 90 is NO, step 91 is carried out, in which it is discriminated whether or not only the optical position detector A is ON. If the discriminated result is YES, the processing proceeds to step 94. On the other hand, if the result in step 91 is NO, step 92 is carried out where it is discriminated whether or not only the optical position detector C is ON. If the discriminated result in step 92 is YES, the processing proceeds to step 95. On the other hand, if the result in step 92 is NO, step 93 is performed. At step 93, it is discriminated whether or not only the optical position detector D is ON. If the discrimination result is negative, step 94 is performed. On the other hand, if the result in step 93 is affirmative, the processing proceeds to step 95.

Figure 9F:
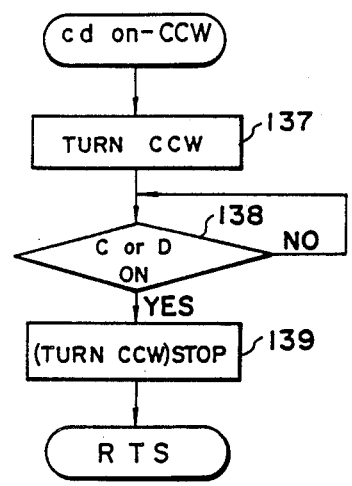
Figure 9G:
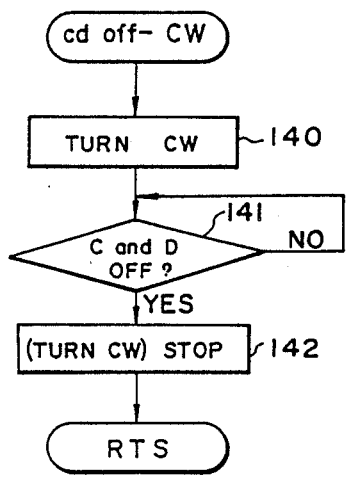

The process in step 94, which is entitled "cd on-cw", is shown in detail in FIG. 9(F). As shown in FIG. 9(F), the arm 100 is turned counterclockwise until the optical position detector C or D is turned ON (steps 137, 138 and 139). Thereby positions of the arm 100 and the wafer 30 are changed as shown in FIGS. 10(G), 11(G) and 12(G). At step 95, which is entitled "cd off-cw" and is shown in detail in FIG. 9(G), the arm 100 is turned clockwise until both the optical position detectors C and D are turned OFF (steps 140, 141 and 142).

Figure 9H:
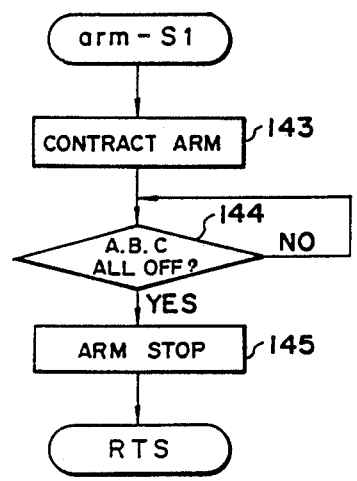

Subsequently, a process in step 102 is carried out. The process in step 102 is entitled "arm-S!", and is shown in detail in FIG. 9(H). At step 102, as shown in FIGS. 10(H), 11(H) and 12(H), the arm 100 is contracted until all the optical position detectors A, B and C are turned OFF (steps 143, 144 and 145). Thereby, positions of the wafer 30 and the arm 10 are changed as shown in FIGS. 10(I), 11(I) and 12(I). It is noted that the center of the wafer 30 becomes placed on the X axis.

Then the arm 100 is driven downwards and the sucking operation is disabled, so that the wafer 30 is placed on the centering stage 40 (step 103). Then the arm 100 is moved to the center position of the centering unit 12 (step 104), and then wafer 30 is held by the suction hole 24 by activating the sucking operation (step 105). Further, the aforementioned process shown in FIG. 9(E) is carried out (step 106). At step 106, the optical position detectors A, B and C are turned ON at the same time. As a result, positions of the arm 100 and the wafer 30 are changed as shown in FIGS. 10(J), 11(J) and 12(J), where the center of the wafer 30 coincides with the center of the centering unit 12.

When both the optical position detectors A and C are ON in step 90 or after the process in step 106 is carried out, a process in step 107 is performed. At step 107, the arm 100 is driven so as to descend and the wafer 30 is placed on the centering stage 40 by disabling the sucking operation. Then the arm 100 is moved to the center position (step 108). Then the sucking operation is turned ON (step 109), and the arm 100 is moved to a home position where the arm 100 is kept in a contracted state shown in FIG. 4(C). Thereafter, the centering stage 40 is driven downwards (step 111), and then the wafer 30 is transported to the carrier station 13 and is then accommodated therein.

The present invention is not limited to the embodiment, and variations and modifications may be made without departing from the scope of the present invention.

What is claimed is:

1. A wafer positioning apparatus comprising:
   first, second and third optical position detectors for detecting a portion of the circumference of a wafer, the wafer having a circumference defined by a first circle of a predetermined diameter, the first, second and third optical position detectors being arranged at respective, angularly displaced positions on a segment of the circumference of a second circle having a diameter identical to that of the first circle, the second optical detector being positioned between the first and third optical position detectors and the respective positions of said detectors being fixed relatively to a predetermined axis passing through the center and along a diameter of the second circle;
   transportation means for holding a wafer and moving the held wafer with respect to the first to third optical position detectors, selectively in a linear direction relative to said axis and in rotation about a second axis transverse to the first axis and exterior to the circumference of the second circle;
   each said detector having ON and OFF states corresponding to the presence or absence of detection of the wafer thereby and producing corresponding output signals; and
   control means for controlling the transportation means in accordance with the output signals of the first to third optical position detectors so that the transportation means moves the wafer by rotation in a first direction until the first optical position detector detects the circumference of the wafer and then in a second direction opposite to the first direction until the third optical position detector detects the circumference of the wafer and than adjusts the position of the wafer on the basis of the outputs from the first and third optical position detectors to align the center thereof with the predetermined axis and then linearly moves the wafer along the predetermined axis until all of the first to third optical position detectors detect corresponding positions on the circumference of the wafer at the same time.

2. A wafer positioning apparatus as claimed in claim 1, further comprising:
   a fourth optical position detector for detecting a portion of the circumference of the wafer, the fourth optical position detector being arranged at a position on the circumference of the second circle which is angularly displaced from the first, second and third detectors,
   the control means selectively responding to the respective outputs of any three of the first to fourth optical position detectors for controlling the transportation means.

3. A wafer positioning apparatus as claimed in claim 2, wherein the first to fourth optical position detectors are arranged at equal, angularly displaced positions.

4. A wafer positioning apparatus as claimed in claim 3, wherein the wafer has an orientation flat portion comprising a straight edge extending as a chord between two points on the circumference of the wafer, and wherein the angle subtended at the center of the second circle by neighboring optical position detectors is greater than the angle subtended by the orientation flat portion of said wafer.

5. A wafer positioning apparatus as claimed in claim 1, wherein the transportation means comprises a transportation robot having an arm which is selectively extendable and contractible and rotatable in clockwise and counterclockwise directions, and wherein the arm has a suction hole at an end portion thereof for holding the wafer by suction.

6. A wafer positioning apparatus for a wafer having a circumference defined by a first circle of a first predetermined diameter and the center of the first circle defining the center of the wafer, comprising:
a set of at least three optical position detectors positioned at angularly spaced locations on the circumference of a second circle having a diameter equal to the diameter of the first circle, the set of detectors comprising at least two outer detectors and at least one intermediate detector angularly spaced therebetween, the angularly spaced locations of the respective detectors being fixed on the circumference of the second circle relatively to a predetermined axis passing through the center and along a diameter of the second circle;
transportation means for holding a wafer in a plane parallel to the plane of the second circle and for moving the wafer, so held, relatively to the set of detectors, selectively in a linear direction and in rotation about an axis of rotation transverse to the predetermined axis and exterior to the circumference of the second circle;
each said detector having first and second states and producing corresponding output signals responsive to the presence or absence of detection of the wafer thereby; and
control means responsive to the output signals of said detectors for controlling the transportation means for moving the wafer relatively to said set of detectors, selectively in rotation and translation, to position the center of the wafer on the predetermined axis and then by translation along the predetermined axis until at least three of the detectors of the set thereof simultaneously detect corresponding positions on the circumference of the wafer thereby to alignment of the center of the wafer with the center of the second circle.

7. A wafer positioning apparatus as claimed in claim 6, wherein:
said set of optical position detectors includes four optical position detectors related as plural, different subsets of at least three detectors, any two said detectors having at least one intermediate detector angularly spaced therebetween functioning as the outer detectors of a subset of at least three detectors; and
the control means responds to the output signals of any of the detector subsets for controlling the transportation means for selectively moving the wafer in translation and rotation to achieve alignment of the center of the wafer with the center of the second circle.

8. A wafer positioning apparatus as claimed in claim 7, wherein the detectors are positioned at equal, angularly spaced locations on the circumference of the second circle.

9. A wafer positioning apparatus as claimed in claim 8, wherein:
the wafer has an orientation flat portion comprising a straight edge extending as a chord between two points of the first circle defining the circumference of the wafer, the chord subtending a first angle at the center of the wafer and thus of the first circle; and
the angle subtended by any two, adjacent and angularly spaced detectors at the center of the second circle is greater than the first angle.

10. A wafer positioning apparatus as claimed in claim 6, wherein the detectors are positioned at equal, angularly spaced locations on the circumference of the second circle.

11. A wafer positioning apparatus as claimed in claim 10, wherein:
the wafer has an orientation flat portion comprising a straight edge extending as a chord between two points of the first circle defining the circumference of the wafer, the chord subtending a first angle at the center of the wafer and thus of the first circle; and
the angle subtended by any two, adjacent and angularly spaced detectors at the center of the second circle is greater than the first angle.

12. A wafer positioning apparatus as claimed in claim 6, wherein:
the control means selectively controls the transportation means to move the wafer in translation parallel to the predetermined axis until detection of the circumference of the wafer, as indicated by a detection output signal of at least one outer detector of the set and, in the absence of simultaneous detection of the circumference by both outer detectors of the set and in response to detection of the circumference by one outer detector of the set, in rotation away from the one outer detector and toward the other outer detector of the set until detection of the circumference of the wafer by at least one intermediate detector and the other outer detector of the set and thereafter selectively in opposite directions of rotation and translation to align the center of the wafer with the predetermined axis and subsequently in translation along the predetermined axis to align the center of the wafer with the center of the second circle.

* * * * *

UNITED STATES PATENT AND TRADEMARK OFFICE
CERTIFICATE OF CORRECTION

PATENT NO. : 4,955,780

DATED : September 11, 1990

INVENTOR(S) : Kazuo SHIMANE et al.

It is certified that error appears in the above-identified patent and that said Letters Patent is hereby corrected as shown below:

Col. 2, line 15, change "waver" to --wafer--.

Col. 3, line 29, change "FIG." to --FIGS.--;
       line 49, change "4(c)" to --4(C)--.

Col. 4, line 10, change "remove" to --moves--.

Col. 5, line 13, change "te" to --the--;
       line 40, after "8(A)" insert --)--.

Col. 6, line 34, after "122)" insert --.--.

Col. 7, line 47, change "arm 10" to --arm 100--.

Col. 8, line 47, change "than" to --then--.

Signed and Sealed this

Fifth Day of May, 1992

Attest:

DOUGLAS B. COMER

*Attesting Officer*  *Acting Commissioner of Patents and Trademarks*